(12) United States Patent
Kottmyer et al.

(10) Patent No.: US 8,702,052 B2
(45) Date of Patent: Apr. 22, 2014

(54) RETENTION STRUCTURE FOR HEAT GENERATING COMPONENT

(75) Inventors: Daniel L. Kottmyer, Springfield, OH (US); Douglas J. Lehr, Eaton, OH (US); Ryan M. Elking, Miamisburg, OH (US)

(73) Assignee: Globe Motors, Inc., Dayton, OH (US)

( * ) Notice: Subject to any disclaimer, the term of this patent is extended or adjusted under 35 U.S.C. 154(b) by 94 days.

(21) Appl. No.: 13/541,982

(22) Filed: Jul. 5, 2012

(65) Prior Publication Data

US 2014/0008504 A1    Jan. 9, 2014

(51) Int. Cl.
*H01L 23/36* (2006.01)

(52) U.S. Cl.
USPC ............................ 248/500; 248/680; 361/709

(58) Field of Classification Search
CPC ................... H01L 23/4093; H01L 2023/4062; H05K 7/12
USPC ........... 248/680, 500, 505; 361/707, 709, 714
See application file for complete search history.

(56) References Cited

U.S. PATENT DOCUMENTS

| | | | | |
|---|---|---|---|---|
| 4,575,038 A * | 3/1986 | Moore | ........................... | 248/505 |
| 4,710,852 A * | 12/1987 | Keen | ............................... | 361/717 |
| 5,099,550 A | 3/1992 | Beane et al. | | |
| 5,415,565 A | 5/1995 | Mosquera | | |
| 5,755,276 A * | 5/1998 | Chiou | ........................... | 165/80.3 |
| 5,777,844 A | 7/1998 | Kiefer | | |
| 5,847,928 A * | 12/1998 | Hinshaw et al. | ............... | 361/704 |
| 6,075,703 A * | 6/2000 | Lee | ............................... | 361/707 |
| 6,082,440 A * | 7/2000 | Clemens et al. | ............. | 165/80.3 |
| 6,154,933 A * | 12/2000 | Vetter et al. | ..................... | 24/295 |
| 6,249,436 B1 * | 6/2001 | Bollesen | ........................ | 361/720 |
| 6,337,796 B2 | 1/2002 | Yamada et al. | | |
| 6,418,025 B1 | 7/2002 | Lee | | |
| 6,435,467 B1 * | 8/2002 | Lai | ................................ | 248/500 |
| 6,640,884 B1 * | 11/2003 | Liu | ............................... | 165/80.3 |
| 7,072,184 B2 * | 7/2006 | Kalyandurg | ................... | 361/704 |
| 7,167,370 B2 | 1/2007 | Lee et al. | | |
| 7,232,332 B2 * | 6/2007 | Osborn et al. | ................ | 439/487 |
| 7,242,593 B2 | 7/2007 | Coutu | | |
| 7,290,638 B2 | 11/2007 | Shiino et al. | | |
| 7,558,067 B2 * | 7/2009 | Lin | ............................... | 361/710 |
| 7,733,651 B2 | 6/2010 | Hogg et al. | | |
| 8,139,361 B2 * | 3/2012 | Hager et al. | .................. | 361/719 |

(Continued)

FOREIGN PATENT DOCUMENTS

WO    9940625    8/1999

OTHER PUBLICATIONS

International Search Report and Written Opinion dated Dec. 16, 2013 for PCT/US2013/049013.

*Primary Examiner* — Bradley Duckworth
(74) *Attorney, Agent, or Firm* — Stevens & Showalter LLP

(57) ABSTRACT

A retention structure for retaining a heat generating component to a heat dissipating substrate. The heat generating component has a heat transfer surface and an opposing biasing surface, and the heat dissipating substrate has opposing first and second sides. The retention structure has a generally U-shaped retention body including an elongated base having opposing ends, and legs extending from the ends of the base. Each of the legs includes a positioning slot. The substrate includes a pair of passages for receiving the legs therethrough, and a pin structure is positioned on the substrate and extends through the positioning slots in the legs to locate the base of the retention body adjacent to the biasing surface and effect a biasing of the heat transfer surface toward the substrate.

23 Claims, 6 Drawing Sheets

(56) References Cited

U.S. PATENT DOCUMENTS

| | | | |
|---|---|---|---|
| 2008/0144289 A1* | 6/2008 | Desrosiers et al. | 361/719 |
| 2008/0151504 A1* | 6/2008 | Eckberg et al. | 361/715 |
| 2009/0052140 A1* | 2/2009 | Li | 361/709 |
| 2009/0103270 A1* | 4/2009 | Desrosiers et al. | 361/719 |
| 2009/0122489 A1 | 5/2009 | Tominaga et al. | |
| 2009/0168358 A1* | 7/2009 | Koike et al. | 361/709 |
| 2010/0172102 A1* | 7/2010 | Sass et al. | 361/709 |
| 2010/0195286 A1 | 8/2010 | Dhawan et al. | |
| 2010/0295498 A1 | 11/2010 | Tominaga et al. | |
| 2010/0321894 A1* | 12/2010 | Wang et al. | 361/709 |

* cited by examiner

RETENTION STRUCTURE FOR HEAT GENERATING COMPONENT

FIELD OF THE INVENTION

The present invention relates to a retention structure for a component and, more particularly, to a retention structure for retaining a heat producing component, such as an electronic component, in biased contact with a heat dissipating structure.

BACKGROUND OF THE INVENTION

Heat generating electronic components are often required to be mounted in association with a heat dissipating structure in order to maintain the component temperature within a desired operating temperature range. The heat dissipating structure may be a separate heat sink provided for the purpose of drawing heat from the component, or an existing structure such as a housing containing and/or supporting the component may also form a heat sink for the component.

A particular example of a heat generating electronic component comprises a solid state electronic relay module that may be located within a motor housing. The motor housing may operate as a heat sink, providing a thermal path for heat to travel away from the electronic relay module to an external surface of the housing. The manner in which the electronic relay module is secured to the housing affects various factors including the character of the thermal connection between the module and the housing, the structural stresses exerted on the module due to differences in thermal expansion at the junction between the different parts, as well as affecting the ease of assembly of the module to the housing. Hence, a retention configuration for mounting the module to the housing has typically required a balance between these often conflicting factors.

SUMMARY OF THE INVENTION

In accordance with one aspect of the invention, a retention structure is provided for retaining a heat generating component to a heat dissipating substrate. The heat generating component has a heat transfer surface and an opposing biasing surface, and the heat dissipating substrate has opposing first and second sides. The retention structure comprises a generally U-shaped retention body including an elongated base having opposing ends, and legs extending from the ends of the base. Each of the legs includes a positioning slot. The substrate includes a pair of passages for receiving the legs therethrough, and a pin structure is positioned on the substrate and is located at a predetermined spacing from the second side of the substrate. The pin structure extends through the positioning slots in the legs to locate the base of the retention body adjacent to the biasing surface and effect a biasing of the heat transfer surface toward the substrate.

In accordance with another aspect of the invention, a component assembly is provided including a retention structure retaining a module comprising a heat generating circuit board in thermal contact with a motor housing defining a heat dissipating substrate. The module has a heat transfer surface and an opposing biasing surface, and the heat dissipating substrate has a first, outer side and an opposing second, inner side. The retention structure comprises a generally U-shaped retention body including an elongated base having opposing ends and legs extending from the ends of the base. The legs extend between a proximal end of the retention body adjacent to the base and an opposing distal end of the retention body. Each of the legs include a positioning slot. The substrate includes a pair of passages for receiving the legs extending outwardly from the inner side to the outer side. A pin structure is positioned on the outer side of the substrate, and the pin structure includes a pair of pin members extending through the positioning slots in the legs to locate the proximal end of the retention body at a predetermined location for exerting a biasing force through the base to bias the heat transfer surface of the module toward the inner side of the substrate.

BRIEF DESCRIPTION OF THE DRAWINGS

While the specification concludes with claims particularly pointing out and distinctly claiming the present invention, it is believed that the present invention will be better understood from the following description in conjunction with the accompanying Drawing Figures, in which like reference numerals identify like elements, and wherein:

DETAILED DESCRIPTION OF THE INVENTION

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

Figure 1:
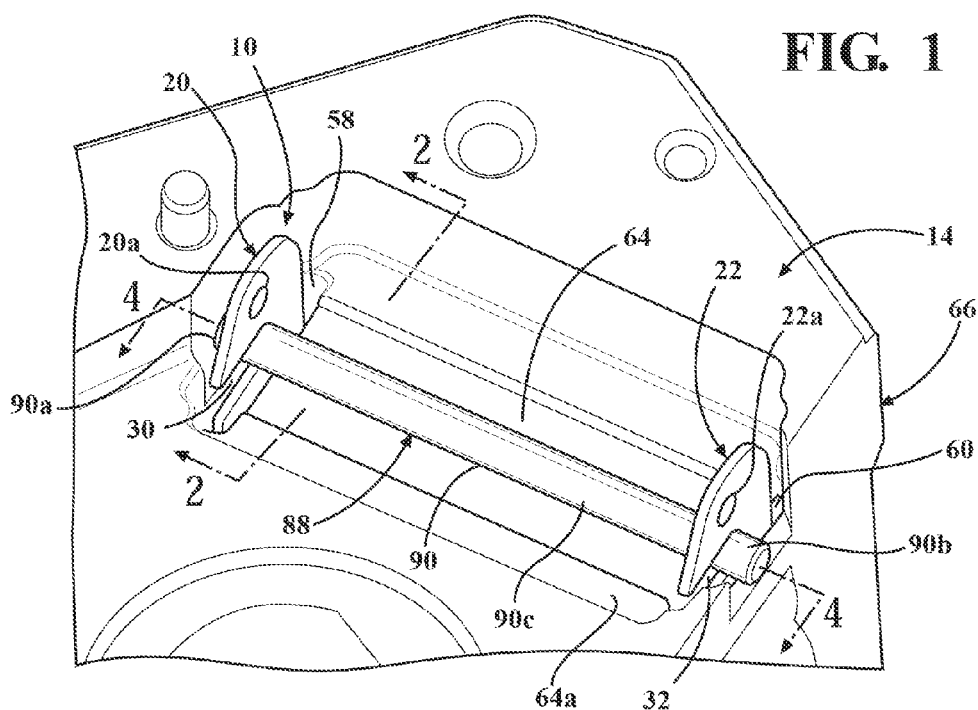
FIG. 1 is perspective view showing a top portion of a motor incorporating a retention structure in accordance with aspects of the present invention.
Figure 2:
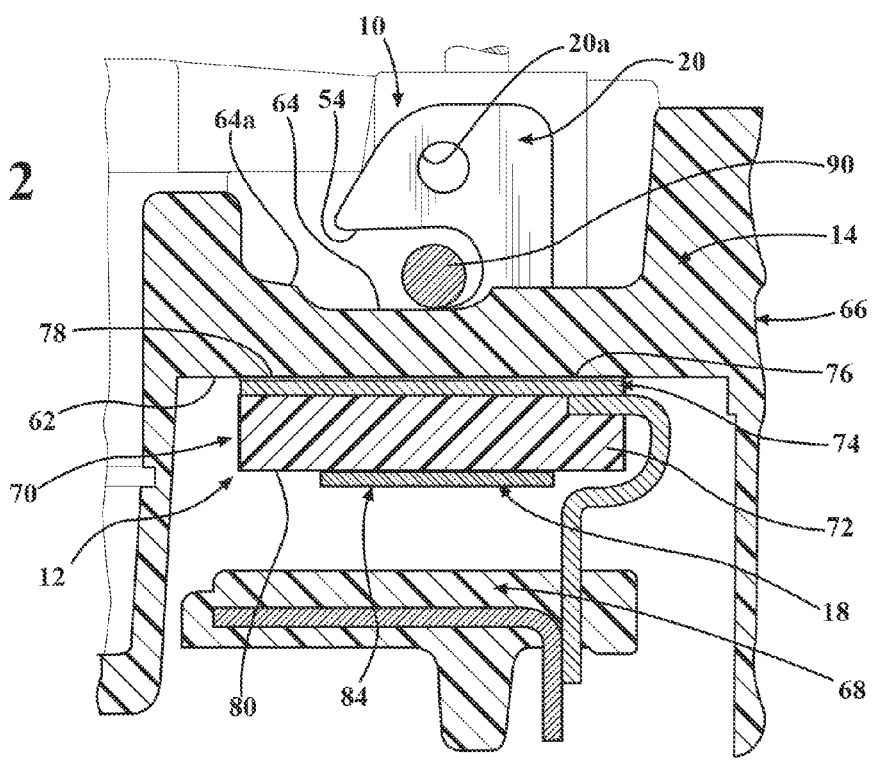
FIG. 2 is a cross-sectional view through the motor of FIG. 1 along line 2-2, illustrating the retention structure.
Figure 3:
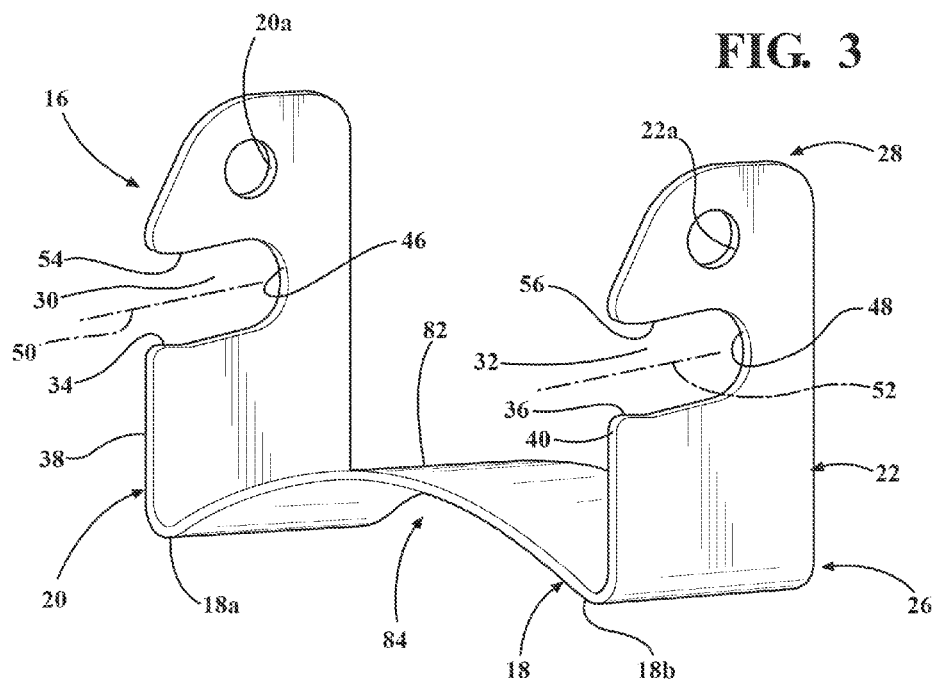
FIG. 3 is a perspective view of a retention body for the retention structure shown in FIG. 2.

Referring to FIGS. 1-3, in accordance with an aspect of the invention, a retention structure 10 is provided for retaining a heat generating component 12 to a heat dissipating substrate 14. The retention structure 10 includes a generally U-shaped retention body 16 including an elongated retention base 18 having opposing ends 18a, 18b, and first and second legs 20, 22 extending from each end 18a, 18b of the base 18. The legs 20, 22 are preferably formed integrally with the retention base 18 at a proximal end 26 of the retention body 16 and extend parallel to each other to a distal end 28 of the retention body 16. Each of the legs 20, 22 includes a respective positioning slot 30, 32.

In the embodiment illustrated in FIG. 3, the positioning slots 30, 32 comprise elongated slots extending into the legs 20, 22 from slot openings 34, 36 located at forward edges 38, 40 of the legs 20, 22. The slots 30, 32 define respective axes that angle outwardly from the retention base 18 in a direction from the slot openings 34, 36 to closed ends 46, 48 of the slots 30, 32, as depicted by slot axes 50, 52. In accordance with a particular aspect of the invention, at least upper or outer edges 54, 56 of the slots 30, 32 angle outwardly, i.e., in a direction from the proximal end 26 toward the distal end 28, extending from the slot openings 34, 36 to the closed ends 46, 48 of the slots 30, 32.

Referring to FIGS. 1 and 2, the heat dissipating substrate 14 includes first and second passages 58, 60 extending therethrough from a first, inner side 62 to a second, outer side 64. In a specific embodiment of the invention, the heat dissipating substrate 14 may comprise an electric motor housing 66, and the passages 58, 60 extend from the inner side 62 of the motor housing 66 facing a stator and leadframe assembly 68 for a motor. The retention structure 10 may be used to retain the heat generating component 12, which may comprise an electronic component, in association with the heat dissipating substrate 14. In the illustrated example, the heat generating component 12 may comprise a solid state electronic relay 70 (FIG. 2), such as may be provided as a safety device in the event of a detected motor short, and including a relay housing 72 and a relay circuit board 74 located at an upper end of the relay housing 72. In order to facilitate transfer of heat, a thermal interface material, such as a thermal grease or thermal film 76, may be located between the inner side 62 of the heat dissipating substrate 14 and a heat transfer surface 78 of the heat generating component 12, as may be defined by an upper side of the circuit board 74. It should be noted that, although the heat generating component 12 and heat dissipating component 14 are described particularly as a solid state electronic relay 70 and a motor housing 66, such a description is solely for illustrative purposes and the present invention is not limited the particular structures or characteristics of the described components.

Figure 4:
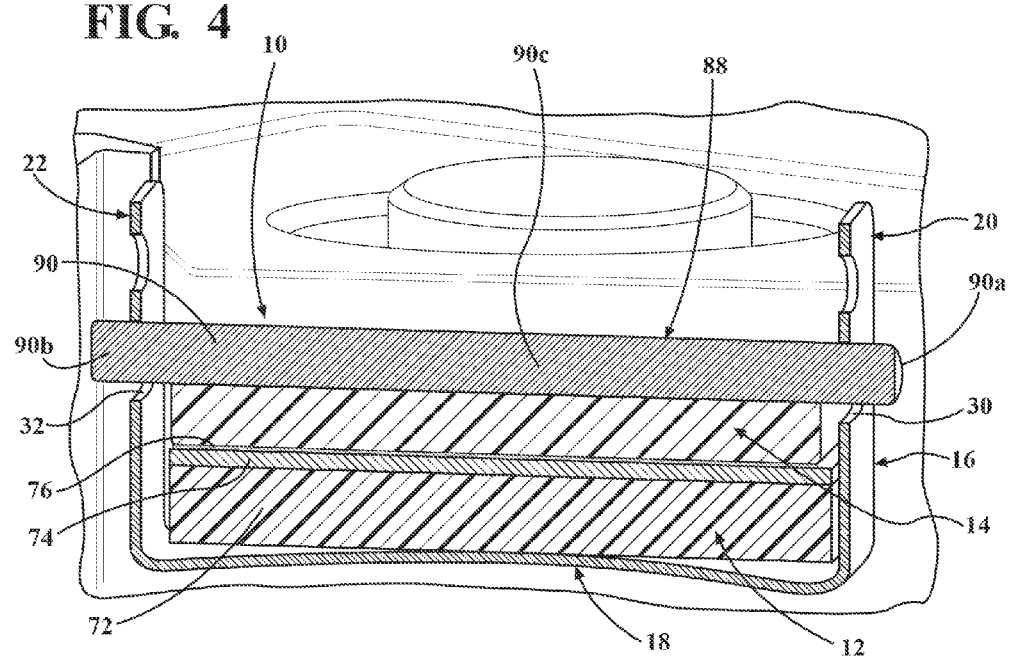
FIG. 4 is a cross-sectional view through the motor of FIG. 1 along line 4-4, illustrating the retention structure.

The retention body 16 is positioned with the legs 20, 22 extending through the passages 58, 60 and with the retention base 18 in engagement with a biasing surface 80 of the heat generating component 12, opposite from the heat transfer surface 78. The legs 20, 22 provide a support for the base 18 to exert a biasing force through a base surface 82 (FIG. 3) facing in the direction of the legs 20, 22. In particular, a resilient structure 84 is associated with the retention body 16 and may comprise any structure associated with the base surface 82. As seen in FIGS. 1-4, the resilient structure 84 may be formed integrally with the base 18, and may comprise forming the retention body of a spring material, such as spring steel, with the base 18 formed in a bowed configuration extending in the direction of the legs 20, 22. As the legs 20, 22 are inserted through the passages 58, 60, at least the central portion of the base 18 engages the biasing surface 80 to bias the heat transfer surface 78 into engagement with the inner side 62 of the heat dissipating substrate 14 with a predetermined force. As seen in FIG. 4, illustrating a final installed position of the retention structure 10, the base 18 may be flexed into a less bowed configuration, such that the base 18 engages the biasing surface 80 with a spring force. The legs 20, 22 each include a respective assembly aperture 20a, 22a that may be grasped, such as by a tool, to draw the legs 20, 22 upwardly through the passages 58, 60 against the spring tension applied at the base 18. The legs 20, 22 are pulled through the passages 58, 60 a predetermined distance and held in position by a pin structure 88.

As seen in FIGS. 1 and 4, the pin structure 88 comprises an elongated structure, and may comprise a rigid structure such as a pin 90 extending between the legs 20, 22. The pin 90 includes opposing pin members or end portions 90a, 90b that are formed integrally with a central portion 90c, wherein the pin 90 has a length that is greater than the distance between the passages 58, 60, such that the end portions 90a, 90b extend through the positioning slots 30, 32 in the legs 20, 22. The end portions 90a, 90b engage with at least the outer edges 54, 56 of the positioning slots 30, 32 to prevent the legs 20, 22 from being extracted from the passages 58, 60. During assembly, the legs 20, 22 are held in position with the positioning slots 30, 32 located outwardly from the passages 58, 60, such as by applying a tensioning force at the apertures 20a, 22a, and the pin 90 is movable along the outer side 64 of the heat dissipating substrate 14, in a direction along the axes 50, 52, to cause the end portions 90a, 90b to engage within the positioning slots 30, 32.

Figure 5:
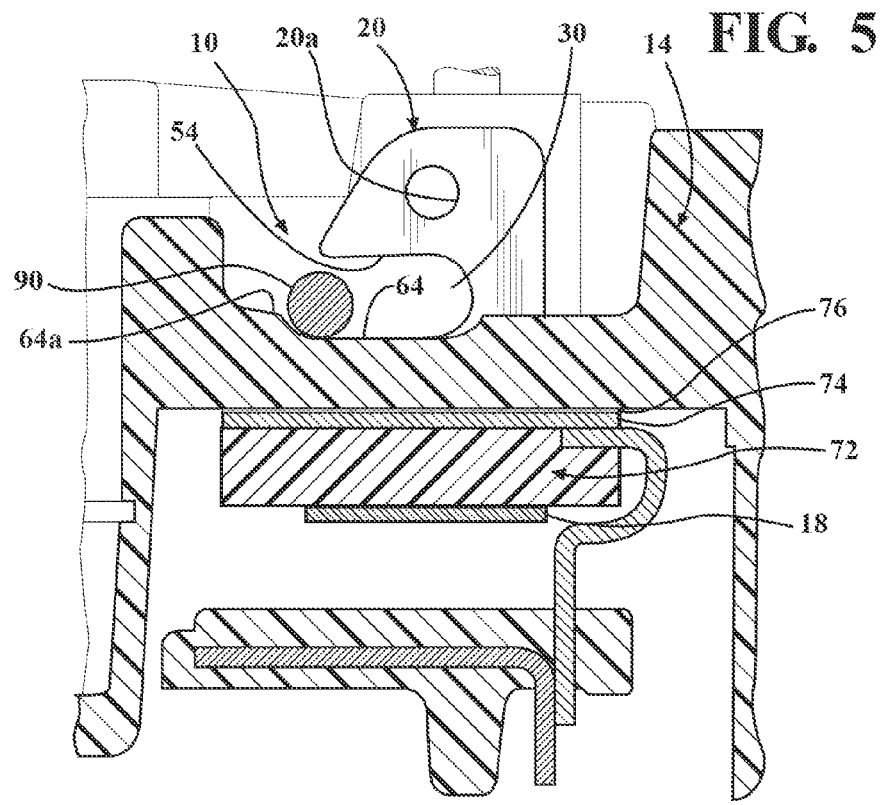
FIG. 5 is a cross-sectional view similar to FIG. 2 and illustrating the retention structure prior to movement of a pin structure into engagement with the retention body.

In particular, referring further to FIG. 5, the pin 90 is initially positioned on the outer side 64 of the heat dissipating substrate 14, adjacent to the slot openings 34, 36. The pin 90 is then moved in a direction generally parallel to the outer side 64 into the positioning slots 30, 32 to position the end portions 90a, 90b adjacent to the closed ends 46, 48 of the positioning slots 30, 32, as shown in FIG. 2. The end portions 90a, 90b may rest in engagement on the outer side 64 of the heat dissipating structure 14 on one or both sides of the respective passages 58, 60.

It may be noted that the angled axes 50, 52 of the positioning slots 30, 32 define a configuration that facilitates retention of the end portions 90a, 90b in the positioning slots 30, 32. In particular, the outer edges 54, 56 extend closer to the outer surface 64 at the slot openings 34, 36 and would require the legs 20, 22 to move against the biasing force of the resilient structure 84 in order for the pin 90 to move out of engagement with the positioning slots 30, 32. In addition, a portion of the outer side 64 of the heat dissipation structure 14 located adjacent to the slot openings 30, 32 may comprise a ramped portion 64a (FIG. 2) that angles inwardly toward the passages 58, 60, providing a surface that resists movement of the pin 90 out of engagement with the legs 20, 22.

Figure 12:
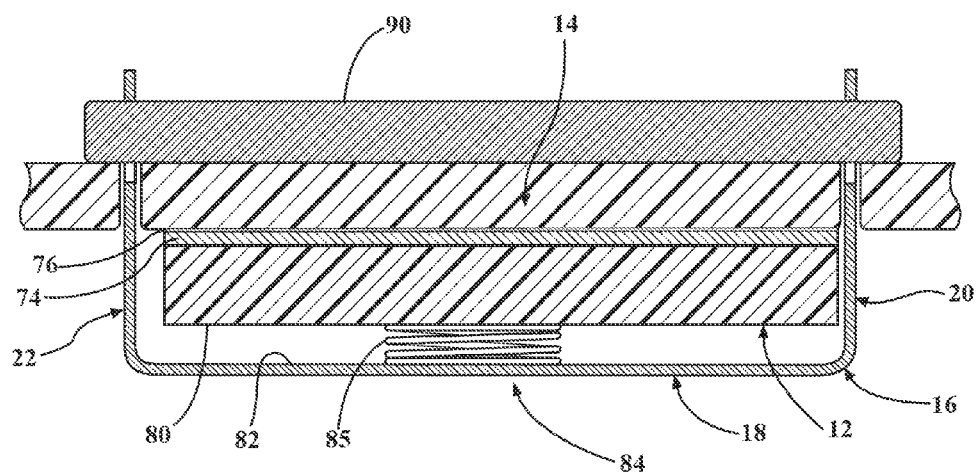
FIG. 12 is a view similar to FIG. 4 illustrating an alternative spring structure for the retention structure.

It should also be understood that inventive aspects of the present invention are not limited to the particular resilient structure 84 described herein. For example, the resilient structure 84 may comprise a coil spring 85 supported on the base surface 82 and engaged against the biasing surface 80, as illustrated in FIG. 12. The base 18 may be formed as a substantially rigid element in this configuration, since the resilient engagement for biasing the heat generating component 12 is provided by the spring 85. Additional resilient structures 84 that may be incorporated in the present invention for biasing the heat generating component 12 into engagement with the heat dissipating structure 14 are illustrated, for example, in U.S. Pat. No. 6,082,440, which patent is incorporated, in its entirety, herein by reference.

Figure 6:
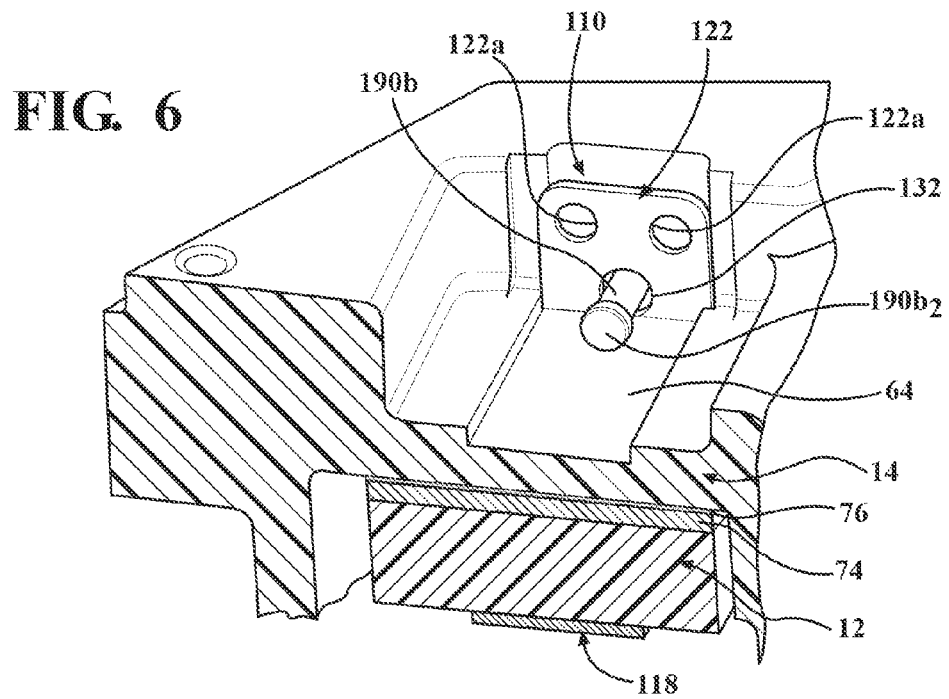
FIG. 6 is perspective view illustrating an alternative aspect of the retention structure.
Figure 7:
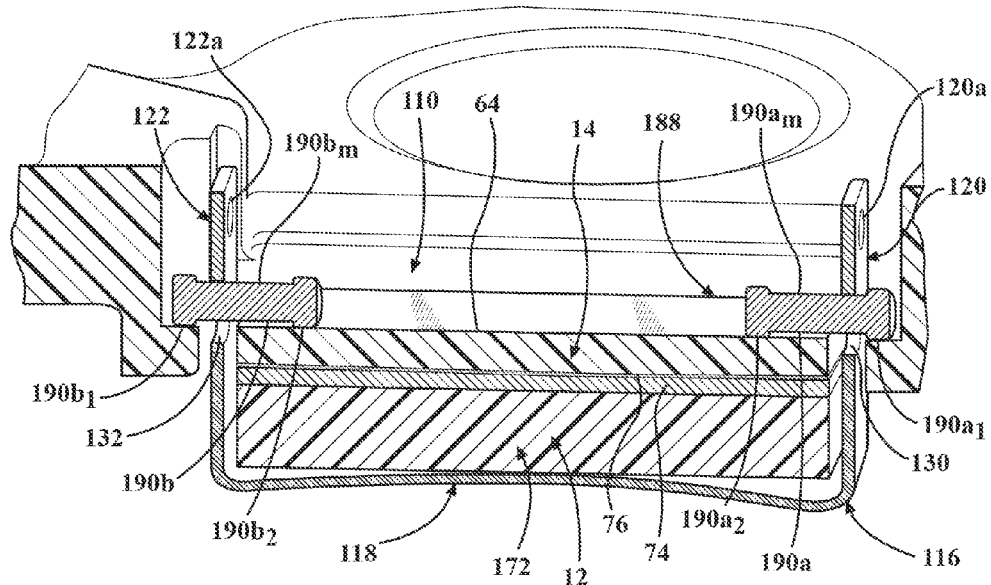
FIG. 7 is a cross-sectional view illustrating the retention structure of FIG. 6.

In accordance with an alternative aspect of the invention, as illustrated in FIGS. 6 and 7, an alternative retention structure 110 is disclosed in which elements corresponding to the retention structure described with reference to FIGS. 1-5 are labeled with the same reference numerals increased by 100. The retention structure 110 includes a retention body 116 that has substantially the same configuration and operation as described above for the retention body 16.

The retention structure 110 includes a pin structure 188 comprising first and second pin members 190a, 190b. The pin members 190a, 190b are configured to be independently movable for engagement within positioning slots 130, 132 of the retention body 116. In the present configuration, the positioning slots 130, 132 comprise closed slots formed as through holes in the legs 120, 122. The pin members 190a, 190b may be inserted into the slots 130, 132 by movement of the pin members 190a, 190b in a direction generally parallel to the outer side 64 of the heat dissipating structure 14. In particular, the pin members 190a, 190b each have a respective first end $190a_1$, $190b_1$ that may be moved into the slots 130, 132 and rest on the outer side 64, and a mid-portion $190a_m$, $190b_m$ engages the slots 130, 132 to resist extraction of the legs 120, 122 out of the passages 158, 160.

The first ends $190a_1$, $190b_1$ of the pin members 190a, 190b define a circumference that is greater than the circumference of the mid-portions $190a_m$, $190b_m$. The enlarged first ends $190a_1$, $190b_1$ provide a configuration that prevents or hinders movement of the pin members 190a, 190b out of the slots 130, 132, such as to prevent inadvertent disengagement of the pin members 190a, 190b from the retention body 116 during operation of the motor. In particular, the enlarged first ends $190a_1$, $190b_1$ define a step or shoulder for engaging against respective outer sides of the legs 120, 122. In addition, second ends $190a_2$, $190b_2$ of the pin members 190a, 190b may also define a circumference larger than that of the mid-portions $190a_m$, $190b_m$ and may be provided to prevent movement of the second ends $190a_2$, $190b_2$ outwardly past the legs 120, 122.

It may be noted that if only one enlarged end $190a_1$, $190b_1$ were provided, movement of the pin members 190a, 190b out of the positioning slots 130, 132 would be prevented by the structure illustrated herein, in that movement of the second ends $190a_2$, $190b_2$ of the pin members 190a, 190b would be limited by engagement of the first ends $190a_1$, $190b_1$ against a wall surface defined adjacent to the first ends $190a_1$, $190b_1$ on the second side 64 of the heat dissipating structure 14.

The legs 120, 122 may also include pairs of assembly apertures. As described above with reference to the retention body 16 of the previous configuration, the pairs of assembly apertures 120a, 122a may be grasped by a tool during assembly to provide a tensioning force to the legs 120, 122 for positioning of the slots 130, 132 above the outer side 64 during insertion of the pin members 190a, 190b.

It should be noted that the pin members 190a, 190b sliding into the closed slots 130, 132 rather than open slots, such as the slots 30, 32 of the retention body 16, provides a stronger structure to the legs 120, 122 that permits higher loads exerted on the heat generating body 12, as illustrated by the engagement of the base 118 with the relay housing 172.

Figure 8:
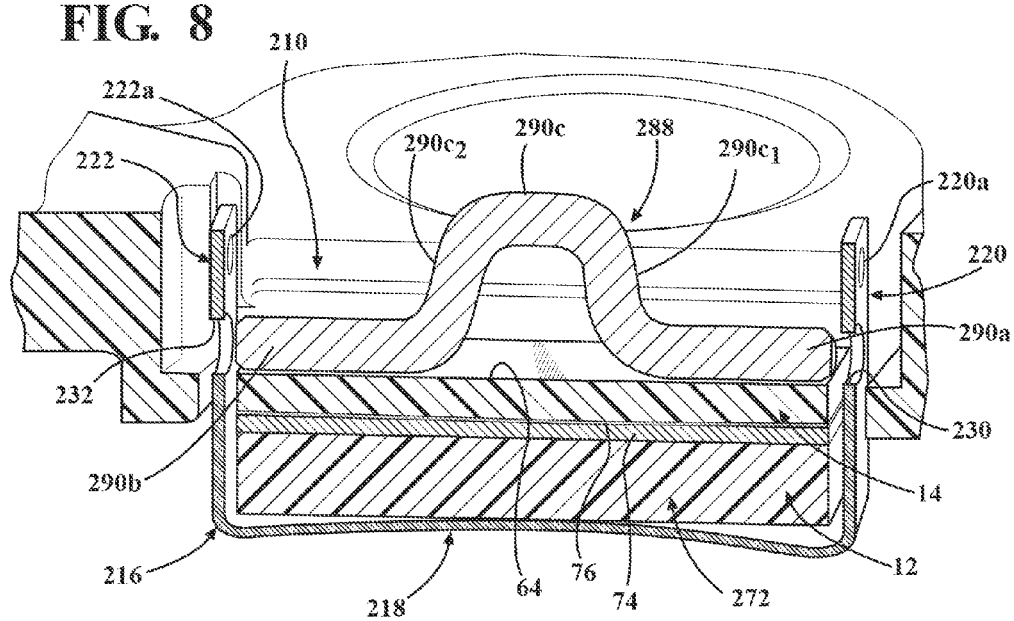
FIG. 8 is a cross-sectional view of another alternative aspect of the retention structure, illustrating a pin structure prior to engagement with a retention body.
Figure 9:
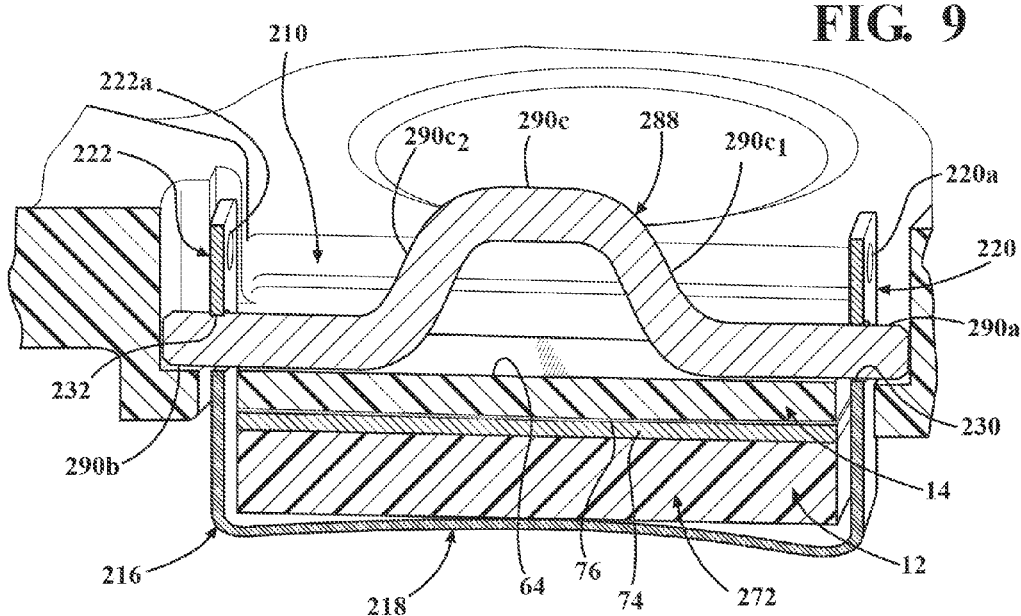
FIG. 9 is cross-sectional view similar to FIG. 8, illustrating the pin structure after engagement with the retention body.

In accordance with another alternative aspect of the invention, as illustrated in FIGS. 8 and 9, an alternative retention structure 210 is disclosed in which elements corresponding to the pin structure described with reference to FIGS. 1-5 are labeled with the same reference numerals increased by 200. The retention structure 210 includes a retention body 216. The retention body 216 may have substantially the same configuration and operation as described above for the retention body 116, including legs 220, 222 having respective closed positioning slots 230, 232 formed by through holes.

A pin structure 288 is provided comprising a pair of independently movable, oppositely directed pin members 290a, 290b for engaging in the positioning slots 230, 232, and a compressible central spring portion 290c for biasing the pin members 290a, 290b outwardly from each other, thereby preventing disengagement of the pin members 290a, 290b from the slots 230, 232. The central spring portion 290c comprises a generally U-shaped structure having sides $290c_1$, $290c_2$ that are integral with the pin members 290a, 290b. The pin structure 288 is preferably made of a resilient or elastic material, such as spring wire, wherein the pin members 290a, 290b are resiliently biased by the central spring portion 290c to move to a position located within the slots 230, 232. A compressive force may be applied to the sides $290c_1$, $290c_2$ to move the pin members 290a, 290b along the outer side 64 of the heat dissipating structure 14 during installation, or removal, of the pin structure 288. That is, the pin members 290a, 290b may be moved toward and away from each other to move the pin members 290a, 290b away from (FIG. 8) and toward (FIG. 9) the positioning slots 230, 232.

Figure 10:
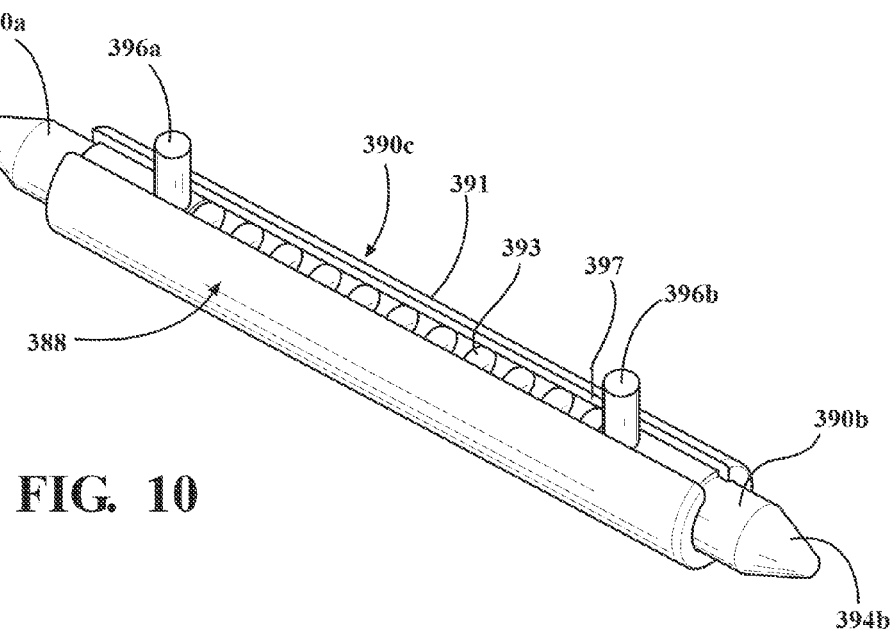
FIG. 10 is a perspective view of a further alternative pin structure.
Figure 11:
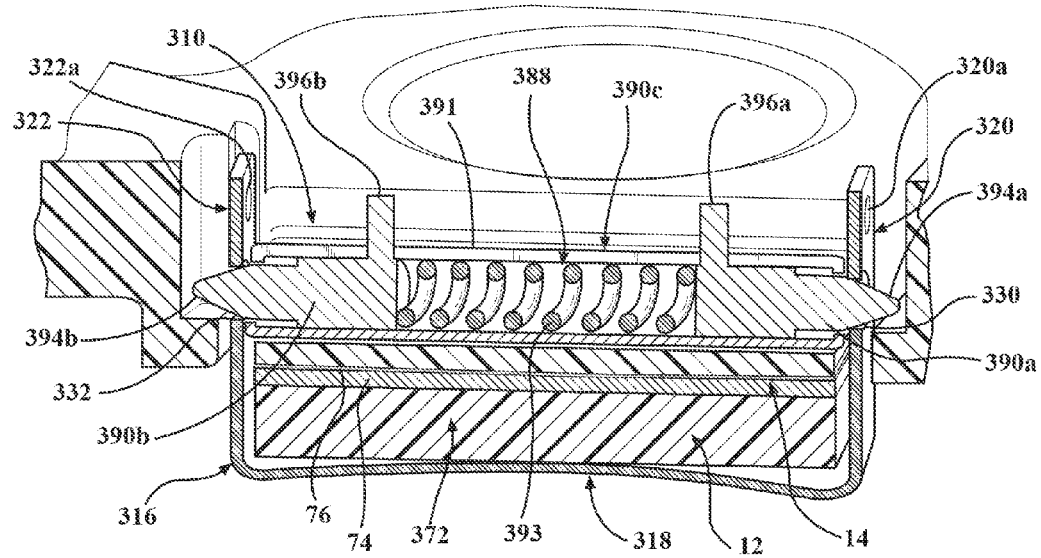
FIG. 11 is a cross-sectional view illustrating a retention structure incorporating the pin structure shown in FIG. 10.

In accordance with a further alternative aspect of the invention, as illustrated in FIGS. 10 and 11, an alternative retention structure 310 is disclosed in which elements corresponding to the retention structure described with reference to FIGS. 1-5 are labeled with the same reference numerals increased by 300. The retention structure 310 includes a retention body 316. The retention body 316 may have substantially the same configuration and operation as described above for the retention body 116, including legs 320, 322 having respective closed slots 330, 332 formed by through holes.

A pin structure 388 is provided comprising a pair of oppositely directed pin members 390a, 390b for engaging in the positioning slots 330, 332, and a compressible central spring portion 390c for biasing the pin members 390a, 390b outwardly from each other. The central spring portion 390c comprises a central spring support member 391 supporting a coil spring structure 393, and the pin members 390a, 390b are located at opposite ends of the coil spring structure 393. The spring support member 391 may comprise any structure for supporting and/or guiding the coil spring structure 393, and in the illustrated configuration comprises a hollow tube containing the coil spring structure 393, and having a longitudinally extending slot 397.

The illustrated pin members 390a, 390b comprise cylindrical members having tapered ends 394a, 394b. A handle 396a, 396b extends outwardly from each of the pin members 390a, 390b and passes outwardly through the longitudinally extending slot 397. During installation of the pin structure 388 into engagement with the retention body 316, the pin members 390a, 390b can be retracted into the spring support member 391 by engaging and moving the handles 396a, 396b toward each other. Outward movement of the pin members 390a, 390b, as they are biased by the coil spring structure 393, accommodates variations in the location of outer edges of the positioning slots 330, 332 relative to the outer side 64 of the heat dissipating substrate 14 to prevent an extracting movement of the legs 320, 322 through the passages 58, 60 in the substrate 14.

Variations on the above-described aspects of the retention structure may be provided. For example, the pin members 390a, 390b described with reference to FIGS. 10 and 11 may be formed as wedge-shaped members having a generally rectangular cross-section, in which case the positioning slots 330, 332 may be formed with a rectangular configuration. Further, the compressible central spring portion 390c may be formed with support structure extending through the coil spring structure 393 and engaging in sliding engagement into ends of the pin members 390a, 390b.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A retention structure for retaining a heat generating component to a heat dissipating substrate, the heat generating component having a heat transfer surface and an opposing biasing surface, and the heat dissipating substrate having opposing first and second sides, the retention structure comprising:
a generally U-shaped retention body including an elongated base having opposing ends, and legs extending from the ends of the base;
each of the legs including a positioning slot;
the substrate including a pair of passages for receiving the legs therethrough; and
a pin structure positioned on the substrate and located at a predetermined spacing from the second side of the substrate, the pin structure extending through the positioning slots in the legs to locate the base of the retention body adjacent to the biasing surface and effect a biasing of the heat transfer surface toward the substrate.

2. The retention structure of claim 1, including a resilient structure associated with the retention body and located to provide a resilient biasing force to the biasing surface.

3. The retention structure of claim 2, wherein the base of the retention body comprises a base surface facing in the direction of the legs, and the resilient structure comprises a spring structure located between the base surface and the biasing surface of the heat generating component.

4. The retention structure of claim 3, wherein the spring structure is formed as a separate spring member supported between the base surface and the biasing surface.

5. The retention structure of claim 2, wherein the resilient structure is formed integrally with the base of the retention body and extends into engagement with the biasing surface.

6. The retention structure of claim 1, wherein the pin structure is movable along the first side of the substrate to engage in the positioning slots.

7. The retention structure of claim 6, wherein the pin structure is movable in a direction generally parallel to the first side of the substrate to engage in the positioning slots.

8. The retention structure of claim 7, wherein the pin structure comprises an elongated structure extending through the positioning slots and resting on the first side of the substrate on at least one side of each of the passages to prevent the legs from moving out of the passages.

9. The retention structure of claim 8, wherein the pin structure comprises a pin having a length greater than the distance between the passages.

10. The retention structure of claim 9, wherein the pin comprises a rigid structure along the length thereof, and the positioning slots are defined as elongated slots extending into edges of the legs for receiving the pin and that define slot openings at the edges.

11. The retention structure of claim 10, wherein the positioning slots angle outwardly away from the base of the retention body, extending in a direction toward a closed end of the slot opposite from the slot opening.

12. The retention structure of claim 10, wherein the first side of the substrate angles inwardly toward the second side of the substrate at a location adjacent to the slot opening.

13. The retention structure of claim 1, wherein the pin structure comprises a pair of oppositely directed pin members for engaging in the positioning slots, and a compressible central spring portion for biasing the pin members outwardly from each other.

14. The retention structure of claim 13, wherein the central spring portion comprises a central spring support member supporting a coil spring structure, and the pin members are located at opposite ends of the coil spring structure.

15. The retention structure of claim 13, wherein the central spring portion comprises a generally U-shaped structure having sides that are integral with the pin members, wherein the sides are resiliently movable toward and away from each other to move the pin members away from and toward the positioning slots.

16. The retention structure of claim 13, wherein the pin members comprise tapered structures and outward movement of the pin members from the central spring portion accommodates variations in the location of outer edges of the positioning slots relative to the first side of the substrate to prevent an extracting movement of the legs through the passages in the substrate.

17. The retention structure of claim 1, wherein the pin structure includes a pair of independently movable pin members extending through the positioning slots and resting on the first side of the substrate on at least one side of each of the passages to prevent the legs from moving out of the passages.

18. The retention structure of claim 17, wherein each of the pin members includes an end portion for engagement with the first side of the substrate and a mid-portion for engagement with a respective positioning slot, and wherein the end portion has a circumference that is greater than a circumference of the mid-portion.

19. A component assembly including a retention structure retaining a module comprising a heat generating circuit board in thermal contact with a motor housing defining a heat dissipating substrate, the module having a heat transfer surface and an opposing biasing surface, and the heat dissipating substrate having a first, outer side and an opposing second, inner side, wherein the retention structure comprises:
a generally U-shaped retention body including an elongated base having opposing ends and legs extending from the ends of the base, the legs extending between a proximal end of the retention body adjacent to the base and an opposing distal end of the retention body;
each of the legs including a positioning slot;
the substrate including a pair of passages for receiving the legs extending outwardly from the inner side to the outer side; and
a pin structure positioned on the outer side of the substrate, the pin structure including a pair of pin members extending through the positioning slots in the legs to locate the proximal end of the retention body at a predetermined location for exerting a biasing force through the base to bias the heat transfer surface of the module toward the inner side of the substrate.

20. The component assembly of claim 19, wherein the pin members are integral with a central portion of the pin structure.

21. The component assembly of claim 20, wherein the positioning slots are defined as elongated slots extending into edges of the legs for receiving the pin members, the elongated slots defining slot openings at the edges of the legs.

22. The component assembly of claim 19, wherein the pin members are inserted into the positioning slots in a direction generally parallel to the outer side of the substrate.

23. The component assembly of claim 22, wherein the pin members are configured to accommodate variations in the location of outer edges of the positioning slots relative to the outer side of the substrate to prevent an extracting movement of the legs through the passages in the substrate.

* * * * *